United States Patent
Gowda

(10) Patent No.: US 8,716,870 B2
(45) Date of Patent: May 6, 2014

(54) DIRECT WRITE INTERCONNECTIONS AND METHOD OF MANUFACTURING THEREOF

(75) Inventor: Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 130 days.

(21) Appl. No.: 13/328,359

(22) Filed: Dec. 16, 2011

(65) Prior Publication Data

US 2013/0154110 A1  Jun. 20, 2013

(51) Int. Cl.
*H01L 23/48* (2006.01)
*H01L 21/50* (2006.01)

(52) U.S. Cl.
USPC .... 257/774; 257/690; 257/734; 257/E21.502; 257/E21.503; 257/E21.506; 438/106; 438/107; 438/126; 438/127

(58) Field of Classification Search
USPC .......... 257/690, 734, 774, E21.502, E21.503, 257/E21.506; 438/106, 107, 126, 127
See application file for complete search history.

(56) References Cited

U.S. PATENT DOCUMENTS

| | | | |
|---|---|---|---|
| 6,232,151 B1 | 5/2001 | Ozmat et al. | |
| 6,306,680 B1 | 10/2001 | Fillion et al. | |
| 7,262,444 B2 | 8/2007 | Fillion et al. | |
| 7,542,301 B1 * | 6/2009 | Liong et al. | 361/761 |
| 2008/0093727 A1 * | 4/2008 | Weidner | 257/700 |

* cited by examiner

*Primary Examiner* — Peniel M Gumedzoe
(74) *Attorney, Agent, or Firm* — Ziolkowski Patent Solutions Group, SC; Jean K. Testa

(57) ABSTRACT

A semiconductor device package having direct write interconnections and method of manufacturing thereof is disclosed. A device package is formed by providing a substrate structure, attaching at least one device to the substrate structure that each include a substrate and one or more connection pads formed on the substrate, depositing a dielectric layer over the at least one device and onto the substrate structure by way of a direct write application, the dielectric layer including vias formed therethrough, and forming an interconnect structure on the dielectric layer that is electrically coupled to the connection pads of the at least one device, the interconnect structure extending through the vias in the dielectric layer so as to be connected to the connection pads.

22 Claims, 4 Drawing Sheets

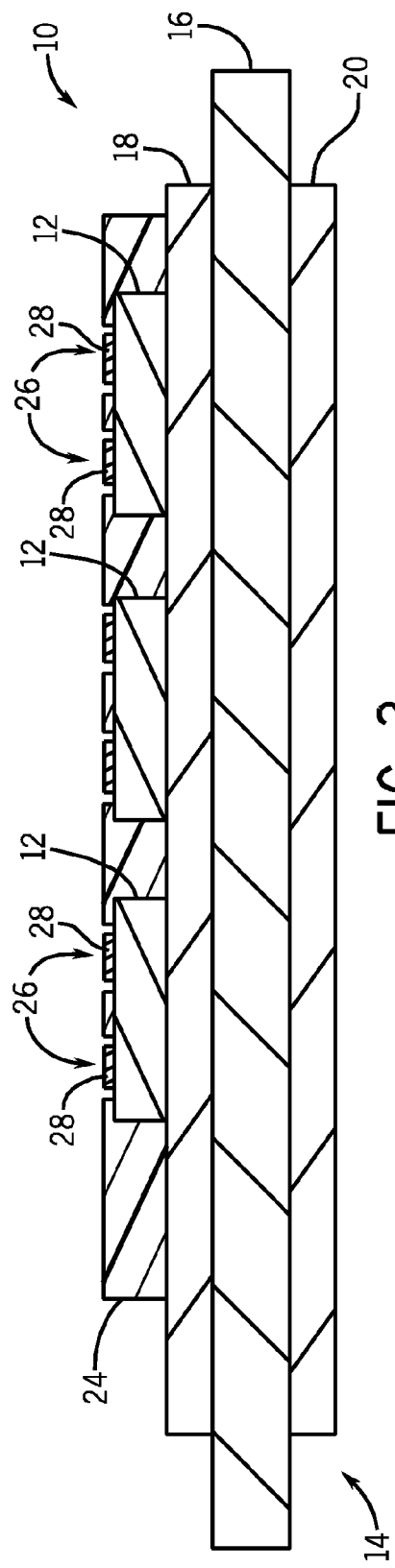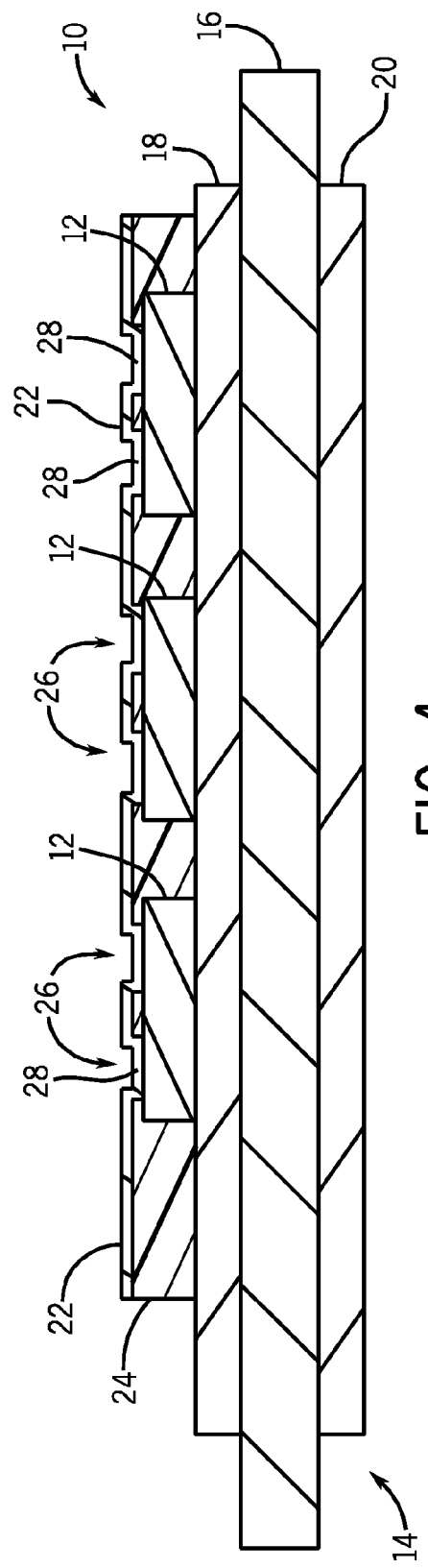

DIRECT WRITE INTERCONNECTIONS AND METHOD OF MANUFACTURING THEREOF

BACKGROUND OF THE INVENTION

Embodiments of the invention relate generally to structures and methods for packaging semiconductor devices and, more particularly, to employing a direct write process to make electrical interconnection to semiconductor devices.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. Examples of common power semiconductor devices include semiconductor light emitting devices (e.g., LEDs) and high voltage power semiconductor devices (e.g., IGBTs).

Several techniques presently are used for electrically connecting power semiconductor devices to an external circuit. In one such technique, power semiconductor devices are assembled onto insulated metal substrates (IMSs) that include a metal baseplate (e.g., aluminum baseplate) covered by a thin layer of dielectric material (e.g., an epoxy-based layer) and a layer of copper. One face of the power semiconductor devices is then typically soldered or silver adhesive attached to the IMS copper and the other terminal/face is wirebonded to the IMS.

In another technique for electrically connecting power semiconductor devices to an external circuit, the power semiconductor devices are connected to the external circuit by way of a power overlay (POL) packaging and interconnect system, with the POL package also providing a way to remove the heat generated by the device and protect the device from the external environment. A standard POL package manufacturing process typically begins with placement of one or more power semiconductor devices onto a dielectric layer by way of an adhesive. In some cases, openings in the dielectric layer that correspond to the devices are formed before placement of the device and in some cases after the placement of the device. Metal interconnects (e.g., copper interconnects) are then electroplated onto the dielectric layer and into the openings (vias) to form a direct metallic connection to the power semiconductor device(s). The metal interconnects may be in the form of a low profile (e.g., less than 200 micrometers thick), planar interconnect structure that provides for formation of an input/output (I/O) system to and from the power semiconductor device(s).

Existing techniques presently employed for electrically connecting power semiconductor devices to an external circuit have several drawbacks associated therewith. For example, the use of wirebonds for attaching power semiconductor devices to an external circuit increases inductance and also increases the profile of the power semiconductor device. Additionally, the use of conventionally manufactured POL packaging for attaching power semiconductor devices to an external circuit increases production time and cost.

Therefore, it would be desirable to provide a low cost approach to providing a thin, low inductance package for power semiconductor devices. It would further be desirable for such a system and method to provide/form a 3D and conformable package to accommodate dies having non-uniform die thicknesses.

BRIEF DESCRIPTION OF THE INVENTION

Embodiments of the invention overcome the aforementioned drawbacks by providing a system and method for making electrical interconnection to semiconductor devices via a direct writing process.

In accordance with one aspect of the invention, a method of forming a device package includes providing a substrate structure, attaching at least one device to the substrate structure that each include a substrate and at least one connection pad formed on the substrate, depositing a dielectric layer over the at least one device and onto the substrate structure by way of a direct write application, the dielectric layer including vias formed therethrough, and forming an interconnect structure on the dielectric layer that is electrically coupled to the at least one connection pad of the at least one device, the interconnect structure extending through the vias in the dielectric layer so as to be connected to the at least one connection pad.

In accordance with another aspect of the invention, a method of manufacturing a semiconductor device package includes providing a substrate structure, attaching at least one semiconductor device to the substrate structure that each include a substrate composed of a semiconductor material and at least one connection pad formed on the substrate, direct writing a dielectric material onto the at least one semiconductor device and onto the substrate structure so as to form a conformal dielectric layer, with the dielectric material being selectively deposited via the direct writing so as to form via openings in the conformal dielectric layer at locations corresponding to the at least one connection pad, and forming an interconnect structure on the conformal dielectric layer that is electrically coupled to the plurality of connection pads of the at least one semiconductor device, the interconnect structure extending through the via openings in the dielectric layer so as to be connected to the at least one connection pad.

In accordance with yet another aspect of the invention, a semiconductor device package includes a substrate structure, semiconductor devices attached to the substrate structure that each include a substrate composed of a semiconductor material and one or more connection pads formed on the substrate, a conformal dielectric layer formed over and around the semiconductor devices, the conformal dielectric layer including one or more vias formed therethrough, and an interconnect structure electrically coupled to the connection pads of the semiconductor devices, the interconnect structure extending through the vias formed through the conformal dielectric layer so as to be connected to the connection pads. The conformal dielectric layer is applied via a direct write application such that the dielectric layer conforms to the semiconductor devices and fills in gaps present between the semiconductor devices.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-5 are schematic cross-sectional side views of the semiconductor device package of FIG. 1 during various stages of a build-up process according to an embodiment of the invention.

DETAILED DESCRIPTION

Embodiments of the present invention provide for a semiconductor device package and interconnect structure, as well as a method of forming such a semiconductor device package. The semiconductor device package is manufactured such that a package buildup is achieved at least partially by employing a direct writing process, with the direct writing process involving jetting, dispensing, laser writing, printing, or a combination of these methods.

Figure 1:
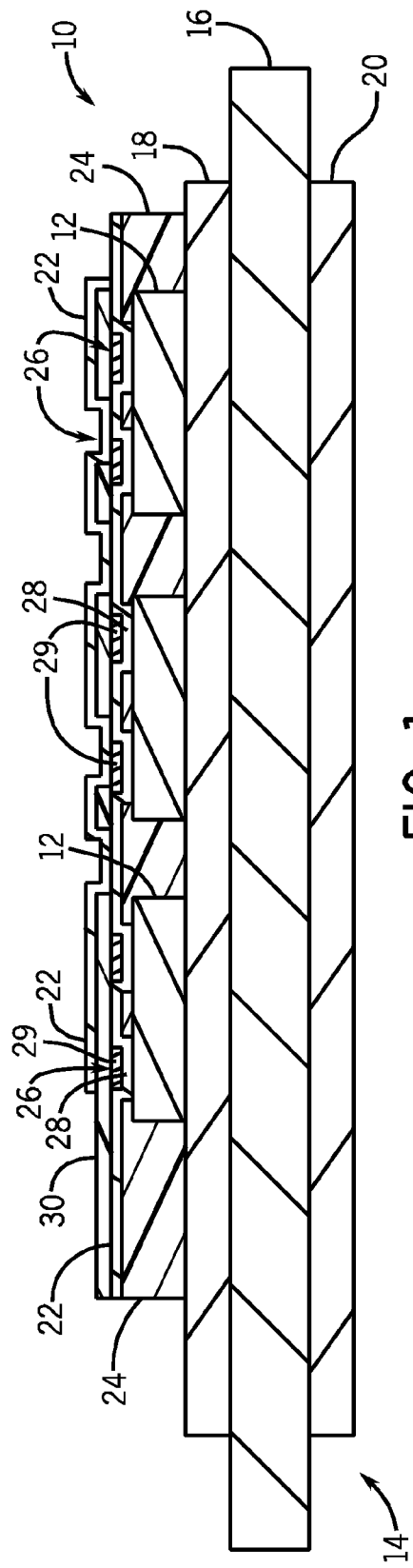
FIG. 1 is a schematic cross-sectional side view of a semiconductor device package according to an embodiment of the invention.

Referring to FIG. 1, a semiconductor device package 10 is shown according to an embodiment of the invention. The semiconductor device package 10 includes one or more semiconductor device(s) 12 therein that, according to various embodiments, may be in the form of a die, diode, other power electronic device, or a passive device such as a capacitor or resistor, and thus semiconductor device(s) 12 are referenced hereafter generally as "devices." As shown in FIG. 1, three device(s) 12 are provided in semiconductor device package 10, however, it is recognized that a greater or lesser number of devices 12 could be included in semiconductor device package 10. The device(s) 12 are attached to a substrate structure 14, such as by way of a soldering process, or an adhesive attachment, or a sintered silver attachment, with the structure of the device and the formation of interconnects on only one side or both sides, determining the proper attachment process to employ. According to embodiments of the invention, the substrate structure 14 can be in the form of an insulated metal substrate (IMS), direct bond copper (DBC) substrate, or printed circuit board. According to one embodiment, and as shown in FIG. 1, the substrate structure 14 includes a base plate (e.g., alumina, ceramic) 16 with a sheet of copper 18, 20 bonded to both sides thereof by a high-temperature joining process. According to embodiments of the invention, different brazing and direct bond technologies may be employed based on, for example, whether tile 16 is composed of alumina or aluminum nitride and silicon nitride, etc. The bottom copper layer 20 on the backside of the DBC substrate 14 is left fully or partially exposed to provide efficient heat transfer out from the POL structure 10. While in a specific embodiment of the invention the substrate structure 14 is in the form of a DBC substrate, it is recognized that aluminum or any other suitable metallic material can be used instead of copper as the metal layer and/or that a ceramic tile or other suitable insulator could be used instead of alumina, and thus such embodiments re considered within the scope of the invention.

As shown in FIG. 1, semiconductor device package 10 also includes a plurality of metal interconnects 22 (i.e., copper traces) formed and patterned onto a dielectric layer 24. According to embodiments of the invention, the dielectric layer 24 may be formed of such materials as polyimides, epoxies, ceramics, paralyene, silicones, and combinations of these materials, etc. The dielectric layer 24 is applied at least partially onto device(s) 12 by way of a "direct write" type application. For example, the dielectric layer 24 may be applied onto device(s) 12 using an ink jet printer type application device, where a dielectric material (e.g., polymer, epoxy, or polyimide) is accurately deposited/printed over, onto, and around device(s) 12 and in the space between the devices. It is recognized, however, that any combination of jetting, dispensing, laser writing, or printing, may be employed in such a direct writing application. In employing a direct writing application technique, areas on device(s) 12 where electrical connection is to be made thereto are left open—that is, via openings 26 are defined/formed. A cleaning process using laser, dry or wet processes can be used to further clean the via openings for metallization as required. The vias 26 are formed at positions corresponding to connection pads 28 (i.e., contact pads) formed on device(s) 12 through which an electrical connection can be made to device(s) 12, so as to expose the connection pads 28.

The metal interconnects 22 are formed along the top surface of dielectric layer 24 and also formed within each of vias 26 to extend down therethrough to connection pads 28 on the device(s) 12. Metal interconnects 22 thus form direct electrical connection to connection pads 28. According to one embodiment, metal interconnects 22 are formed by way of applying a metal layer/material, such as using a sputtering and electroplating process, and then subsequently patterning the applied metal material into metal interconnects 22 having a desired shape. That is, the metal interconnects 22 are formed by applying a titanium or other suitable adhesion layer and copper seed layer via a sputtering and/or evaporation process, followed by electroplating of additional copper thereon to increase a thickness of the metal interconnects 22 and form copper traces. According to another embodiment, the metal interconnects 22 are formed by a direct write process, where metallic material is directly written or printed to form interconnects. The vias 26 may be filled using a via fill material 29, such as conductive ink, adhesive or paste that is subsequently cured to enhance the electrical, thermal, or mechanical properties of the interconnects 22. Other additive methods of applying metal interconnects can also be used. In another embodiment, a print and plate process can be used when a thin layer of metal is printed using a metal ink and used as a seed to plate copper, with an electrolytic or electro-less process being used for plating copper, for example.

As further shown in FIG. 1, one or more additional dielectric layers 30 can be added to packaging structure 10, with each additional dielectric layer 30 having metal interconnects 22 deposited and patterned thereon. Similar to the forming/application of dielectric layer 24, the additional dielectric layer 30 can be applied via a direct write process, such as by using an ink jet printer type application device that selectively and accurately deposits a dielectric material. Vias 26 are formed in the additional dielectric layer at desired locations by way of the accurate and selective depositing of dielectric material that is enabled by a direct writing application process. As indicated above, metal interconnects 22 can be formed on the additional dielectric layer 30 by way of a sputtering and electroplating process or by way of a direct writing process where metallic material is directly written or printed to form interconnects 22. According to one embodiment, the vias 26 can then be filled using a via fill material (e.g., conductive ink or paste) that is subsequently cured to enhance the electrical, thermal, or mechanical properties of the interconnects 22.

Figure 2:
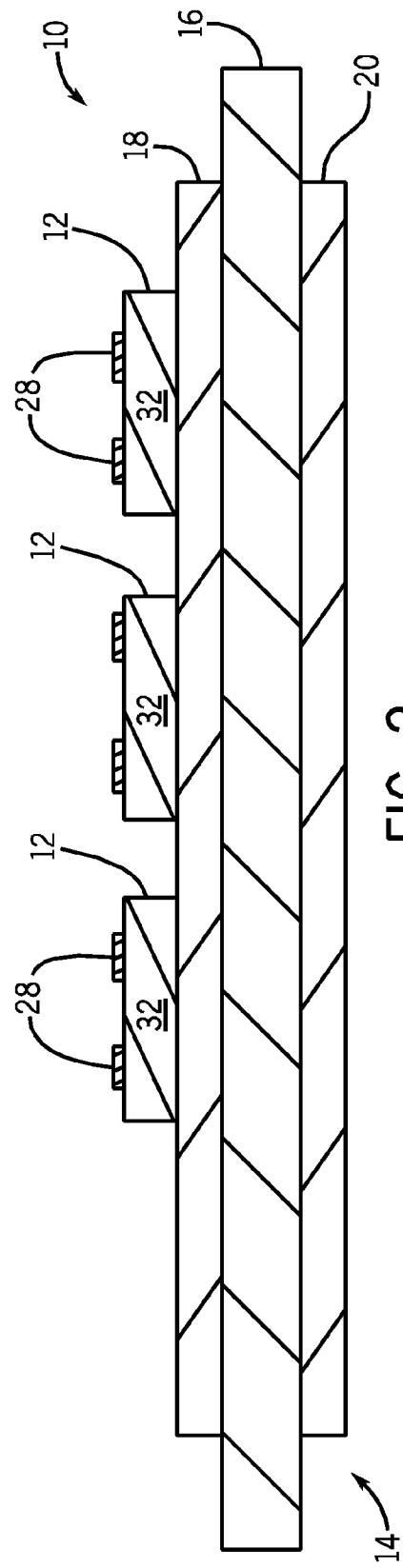

Referring now to FIGS. 2-5, detailed views of the process steps for a technique of manufacturing the semiconductor device package 10 of FIG. 1 are provided, according to an embodiment of the invention. Referring to FIG. 2, the build-up process of semiconductor device package 10 begins with the placement and attachment of devices 12 to a substrate structure 14, such as an IMS, DBC, or printed circuit substrate, for example, although other multi-layer substrate structures are also envisioned as being used. Each of the devices 12 is constructed of a substrate 32 with one or more connection pads 28 formed on a top surface of the substrate 32. According to one embodiment, devices 12 are attached to substrate structure 14 by way of a solder material (not shown), so as to secure the devices 12 and substrate structure 14 together, although it is recognized that an adhesive or sintered silver could also be used, with the structure of the device and the formation of interconnects on only one side or both sides determining the desired attachment material to be employed.

In a next step of the build-up process, and as shown in FIG. 3, a dielectric layer 24 is applied to and formed on the devices 12 and substrate structure 14. According to embodiments of the invention, the dielectric layer 24 may be formed of a material such as a polyimide, epoxy, paralyene, silicone, ceramic or other suitable depositable material. The dielectric layer 24 is applied onto devices 12 by way of a direct writing type application, such as being applied via an ink jet printer type application device where a dielectric material (e.g., polymer, epoxy, or polyimide) is accurately deposited/printed over, onto, and around devices 12 and in the space between the devices 12. In additional embodiments, the direct writing type application can include any combination of jetting, dispensing, laser writing, or printing, in applying dielectric layer 24. After deposition, the dielectric layer 24 may need curing, and this curing may be accomplished in several different ways, such as insitu for example. In applying dielectric material via the direct writing application technique, areas on devices 12 where electrical connection is to be made are left open, so as to form via openings at selected locations, with it being recognized that a cleaning process using laser, dry, or wet processes can be used to further clean the via openings for metallization as required. The vias 26 are formed at positions corresponding to connection pads 28 (i.e., contact pads) formed on device(s) 12 through which an electrical connection can be made to device(s) 12, so as to expose the connection pads 28.

As shown in FIG. 3, dielectric layer 24 is a conformable layer that deposited/printed over, onto, and around devices 12 and in the space between the devices 12. Application of the dielectric material over, onto, and around the devices 12 by way of the direct writing type application enables formation of the conformable dielectric layer 24, as the direct writing application provides for a three dimensional (3D) application of dielectric material onto the devices 12 and substrate structure 14.

Referring now to FIG. 4, upon depositing of the dielectric layer 24 onto devices 12 and the formation of vias 26, the vias 26 are subsequently metalized to form interconnects 22. According to one embodiment, and as shown in FIG. 4, the metal interconnects 22 are formed by a direct writing process, where metallic material is directly written or printed on dielectric layer 24 and in vias 26. To enhance the electrical, thermal, or mechanical properties of the metal interconnects 22, the vias 26 may then be filled with a via fill material 29, such as conductive ink or paste, that is subsequently cured. As shown in FIG. 4, according to one embodiment, metal interconnects 22 form direct metallic and electrical connections to connection pads 28 on devices 12. The metal interconnects 22 extend out from connection pads 28 of devices 12, through vias/opening 26, and out across a top surface of dielectric layer 24

According to another embodiment, the metal interconnects 22 are formed through a combination of sputtering and electroplating applications, although it is recognized that other electroless methods of metal deposition could also be used. For example, a titanium adhesion layer and copper seed layer may first be applied via a sputtering or evaporation process, followed by an electroplating process that increases a thickness of the copper to a desired level. In such an embodiment where sputtering and plating are employed to form interconnects 22, it is recognized that subsequent patterning may be required to form/route the interconnects in a desired fashion.

Figure 5:
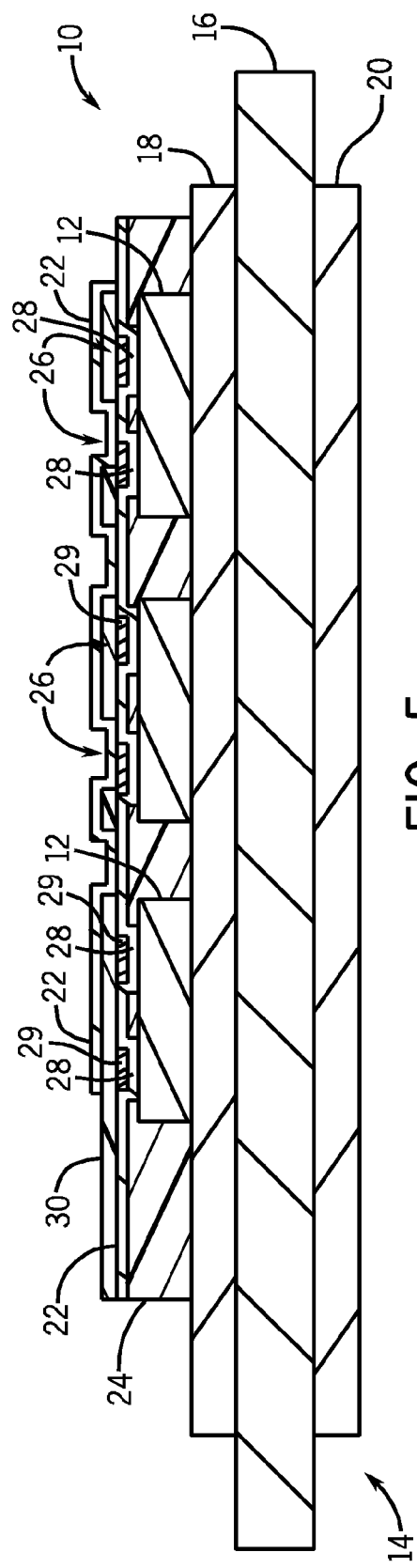

In a next step of the build-up process, and as shown in FIG. 5, one or more additional dielectric layers 30 are added onto packaging structure 10, with each additional dielectric layer 30 having metal interconnects 22 formed thereon. The additional dielectric layer 20 is again at least partially applied via a direct writing process, such as by using an ink jet printer or dispensing type application device that selectively and accurately deposits a dielectric material. Vias 26 are formed in the additional dielectric layer 30 (i.e., holes/vias 26 are left void of dielectric material) at desired locations by way of the accurate and selective depositing of dielectric material that is enabled by the direct writing application process. As indicated above, the metal interconnects 22 can be formed on the additional dielectric layer 30 by way of a sputtering and electroplating process or by way of a direct writing process or a combination of the two methods, where metallic material is directly written or printed. According to one embodiment, the vias 26 are then filled using a conductive medium 29, such as conductive ink or paste, that is subsequently cured to enhance the electrical, thermal, and/or mechanical properties of the metal interconnects 22.

Figure 6:
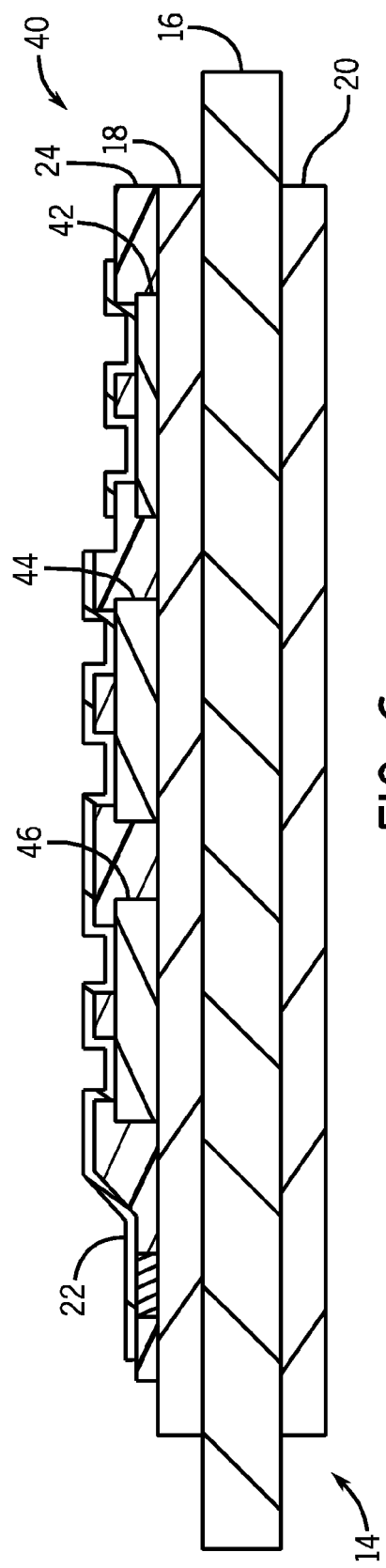
FIG. 6 is a schematic cross-sectional side view of a semiconductor device packaging structure according to another embodiment of the invention.

Referring now to FIG. 6, a semiconductor device package 40 is shown according to another embodiment of the invention. The semiconductor device package 40 of FIG. 6 is similar to semiconductor device package 10 shown in FIG. 5, except that the devices 42, 44, 46 included therein have differing/non-uniform die thicknesses, such that a top surface/plane roughly defined by the devices has differing heights. For example, a first device 42 may have a reduced thickness as compared to second and third device 44, 46. In applying a dielectric layer 24 onto devices 42, 44, 46 and substrate structure 14, the direct writing application process provides for a three dimensional (3D) application of dielectric material onto the devices 42, 44, 46 and substrate structure 14. As such, by employing the direct writing application process for applying/depositing the dielectric material, it is possible to form a conformable dielectric layer 24 onto/about devices 42, 44, 46.

Figure 7:
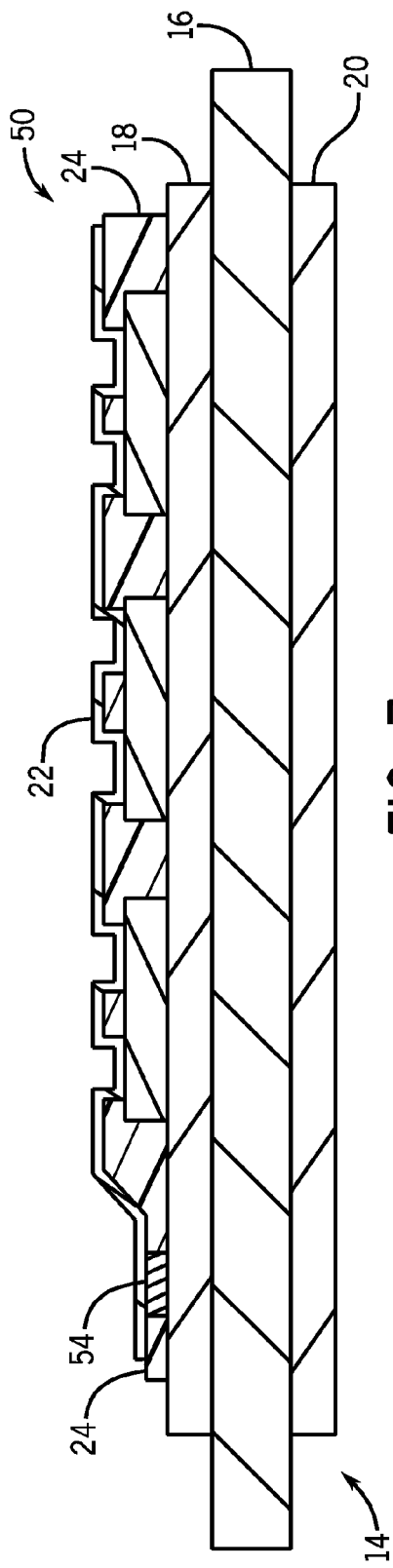
FIG. 7 is a schematic cross-sectional side view of a semiconductor device packaging structure according to another embodiment of the invention.
Figure 8:
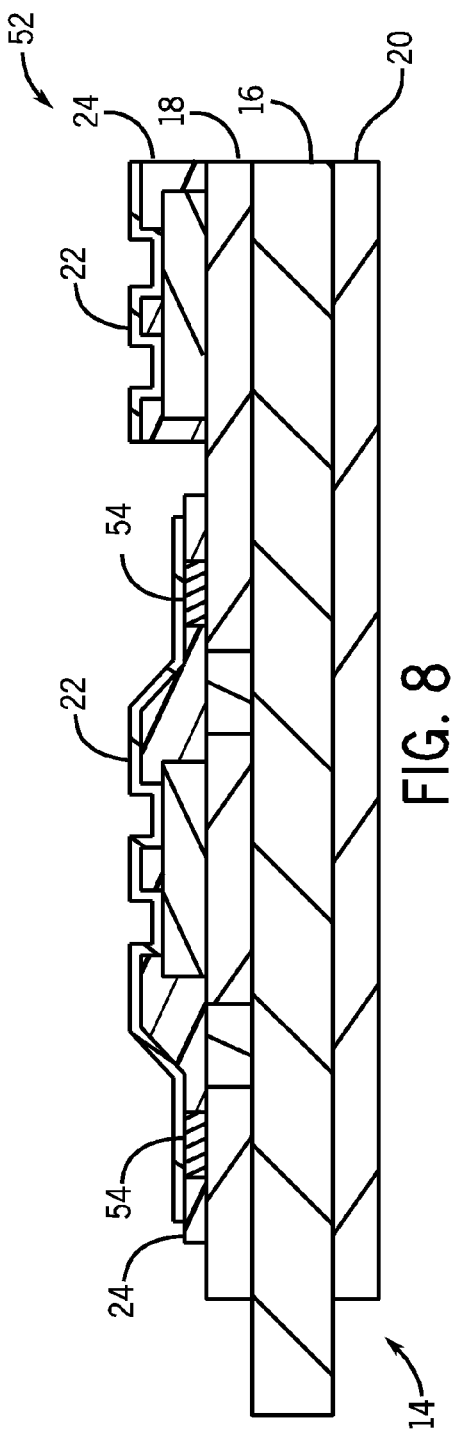
FIG. 8 is a schematic cross-sectional side view of a semiconductor device packaging structure according to another embodiment of the invention.

FIGS. 7 and 8 illustrate additional embodiments of the invention, where alternative constructions of a semiconductor device package are provided. In particular, the semiconductor device packages 50, 52 in FIGS. 7 and 8 include alternative constructions for bringing the interconnects 22 back to (i.e., connecting with/to) the copper layer 18 of substrate structure 14, for purposes of connecting a top side of devices 12 to the copper layer 18. In each of semiconductor device packages 50, 52, the interconnects 22 are connected to layer 18 of the substrate structure 14 by way of one or more feedthroughs 54 that are formed through dielectric layer 24.

Beneficially, formation of the dielectric layers 24, 30 and/or interconnects 22 by way of the direct writing process provides for the accurate deposition of dielectric material over 3D surfaces and allows for the deposition of very fine features. Employing of the direct writing process in the build-up of semiconductor device package 10, 40, according to embodiments of the present invention, provides a low cost approach to a thin, low inductance package for semiconductor devices. Use of the direct writing process in the build-up of the semiconductor device package 10, 40 allows for the use of non-uniform die thicknesses to be used, as the direct write process/application can be performed in three dimensions and provides for application of a conformable dielectric layer. Technical advantages that are provided by the direct write process/application include lower package inductance and a smaller package profile as compared to wirebonding technology. Commercially, semiconductor device packages built-up using a direct write application can provide higher performance than wirebond technology, at lower cost than other build-up techniques for producing high performance POL packages.

Therefore, according to one embodiment of the invention, a method of forming a device package includes providing a substrate structure, attaching at least one device to the substrate structure that each include a substrate and at least one connection pad formed on the substrate, depositing a dielectric layer over the at least one device and onto the substrate structure by way of a direct write application, the dielectric layer including vias formed therethrough, and forming an interconnect structure on the dielectric layer that is electrically coupled to the at least one connection pad of the at least one device, the interconnect structure extending through the vias in the dielectric layer so as to be connected to the at least one connection pad.

According to another embodiment of the invention, a method of manufacturing a semiconductor device package includes providing a substrate structure, attaching at least one semiconductor device to the substrate structure that each include a substrate composed of a semiconductor material and at least one connection pad formed on the substrate, direct writing a dielectric material onto the at least one semiconductor device and onto the substrate structure so as to form a conformal dielectric layer, with the dielectric material being selectively deposited via the direct writing so as to form via openings in the conformal dielectric layer at locations corresponding to the at least one connection pad, and forming an interconnect structure on the conformal dielectric layer that is electrically coupled to the plurality of connection pads of the at least one semiconductor device, the interconnect structure extending through the via openings in the dielectric layer so as to be connected to the at least one connection pad.

According to yet another embodiment of the invention, a semiconductor device package includes a substrate structure, semiconductor devices attached to the substrate structure that each include a substrate composed of a semiconductor material and one or more connection pads formed on the substrate, a conformal dielectric layer formed over and around the semiconductor devices, the conformal dielectric layer including one or more vias formed therethrough, and an interconnect structure electrically coupled to the connection pads of the semiconductor devices, the interconnect structure extending through the vias formed through the conformal dielectric layer so as to be connected to the connection pads. The conformal dielectric layer is applied via a direct write application such that the dielectric layer conforms to the semiconductor devices and fills in gaps present between the semiconductor devices.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of forming a device package comprising:
   providing a substrate structure;
   attaching at least one device to the substrate structure such that the at least one device extends outwardly from a surface of the substrate structure, each of the at least one device including a substrate and at least one connection pad formed on the substrate;
   depositing a dielectric layer over the at least one device and onto the substrate structure by way of a direct write application, the dielectric layer including vias formed therethrough;
   forming an interconnect structure on the dielectric layer that is electrically coupled to the at least one connection pad of the at least one device, the interconnect structure extending through the vias in the dielectric layer so as to be connected to the at least one connection pad;
   filling the vias with a via fill material; and
   curing the fill material;
   wherein the fill material enhances the electrical, thermal, or mechanical properties of the interconnect structure.

2. The method of claim 1 wherein depositing the dielectric layer by way of the direct write application comprises selectively depositing dielectric material at desired locations.

3. The method of claim 2 wherein the selective depositing of dielectric material at the desired locations leaves openings in the dielectric layer, the openings forming the vias.

4. The method of claim 2 wherein the dielectric material is selectively deposited using at least one of an ink jet printer application, dispensing, laser writing, or printing technique, or a combination thereof.

5. The method of claim 1 wherein the at least one device comprises a plurality of devices, the plurality of devices including at least one of a die, diode, power electronic device, and a passive device.

6. The method of claim 5 wherein the plurality of devices have differing thicknesses so as to extend out from the substrate structure at a plurality of different heights.

7. The method of claim 5 wherein the dielectric layer is deposited by way of the direct write application so as to conform three dimensionally to and about the plurality of devices and so as to at least partially fill in gaps present between the plurality of devices in all three dimensions.

8. The method of claim 1 wherein forming the interconnect structure comprises:
   applying a seed layer of metal material via a sputtering or evaporation process; and
   electroplating additional metal material to the seed layer; and
   patterning the metal material to form the interconnect structure.

9. The method of claim 1 wherein forming the interconnect structure comprises applying metal material by way of a direct writing application to form metallic traces within the vias down to the at least one connection pad and on the dielectric layer.

10. The method of claim 9 wherein the metal material applied by way of the direct writing application forms a seed layer, and wherein the method further comprises plating an additional metal material onto the seed layer to form the interconnect structure.

11. The method of claim 1 further comprising:
    depositing an additional dielectric layer over the dielectric layer and interconnect structure by way of a direct write application; and
    forming an interconnect structure on the additional dielectric layer.

12. A method of manufacturing a semiconductor device package comprising:
   providing a substrate structure;
   attaching at least one semiconductor device to the substrate structure, each of the at least one semiconductor device including a substrate composed of a semiconductor material and at least one connection pad formed on the substrate;
   direct writing a dielectric material onto the at least one semiconductor device and onto the substrate structure so as to form a conformal dielectric layer, the dielectric material being selectively deposited via the direct writing so as to form one or more via openings in the conformal dielectric layer at locations corresponding to the at least one connection pad;
   forming an interconnect structure on the conformal dielectric layer that is electrically coupled to the at least one connection pad of the at least one semiconductor device, the interconnect structure extending through the via openings in the dielectric layer so as to be connected to the at least one connection pad;
   filling the vias with a via fill material; and
   curing the material;
   wherein the via fill material enhances the electrical, thermal, or mechanical properties of the interconnect structure.

13. The method of claim 12 wherein the dielectric material is selectively deposited via direct writing using at least one of a jetting, dispensing, laser writing, or printing technique, or a combination thereof ink jet printer application.

14. The method of claim 12 wherein forming the interconnect structure comprises:
   applying a seed layer of metal material via a sputtering or evaporation process;
   plating additional metal material to the seed layer; and
   patterning the metal material to form the interconnect structure.

15. The method of claim 12 wherein forming the interconnect structure comprises direct writing a metal material to form metallic traces within the vias down to the at least one connection pad and on the conformal dielectric layer.

16. The method of claim 15 wherein the metal material applied by way of the direct writing application forms a seed layer, and wherein the method further comprises plating an additional metal material onto the seed layer to form the interconnect structure.

17. The method of claim 12 further comprising:
   direct writing an additional conformal dielectric layer over the dielectric layer and interconnect structure; and
   forming an interconnect structure on the additional conformal dielectric layer.

18. A semiconductor device package comprising:
   a substrate structure;
   semiconductor devices attached to the substrate structure, with each of the semiconductor devices including a substrate composed of a semiconductor material and one or more connection pads formed on the substrate;
   a conformal dielectric layer formed over and around the semiconductor devices, the conformal dielectric layer including one or more vias formed therethrough;
   an interconnect structure electrically coupled to the plurality of connection pads of the semiconductor devices, the interconnect structure extending through the vias formed through the conformal dielectric layer so as to be connected to the connection pads; and
   a fill material filled into the vias, the fill material being cured so as to enhance the electrical, thermal, or mechanical properties of the interconnect structure;
   wherein the conformal dielectric layer is applied via a direct write application such that the dielectric layer conforms to the semiconductor devices and fills in gaps present between the semiconductor devices.

19. The semiconductor device package of claim 18 wherein the interconnect structure comprises a plurality of metallic traces applied via a direct write application.

20. The semiconductor device package of claim 18 further comprising a via fill material deposited in the vias.

21. The semiconductor device package of claim 18 further comprising:
   an additional dielectric layer positioned over the dielectric layer and the interconnect structure by way of a direct write application, the additional dielectric layer being applied via a direct write application such that the dielectric layer is configured as a conformal dielectric layer; and
   an interconnect structure formed on the additional dielectric layer.

22. The semiconductor device package of claim 18 wherein the semiconductor devices have differing thicknesses so as to extend out from the substrate structure at a plurality of different heights, and wherein the conformal dielectric layer conforms to the semiconductor devices of differing thicknesses.

* * * * *